(12) United States Patent
Shiraishi

(10) Patent No.: US 11,437,231 B2
(45) Date of Patent: Sep. 6, 2022

(54) METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Tatsuya Shiraishi, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 278 days.

(21) Appl. No.: 16/813,029

(22) Filed: Mar. 9, 2020

(65) Prior Publication Data
US 2021/0074540 A1 Mar. 11, 2021

(30) Foreign Application Priority Data
Sep. 9, 2019 (JP) .............................. JP2019-163790

(51) Int. Cl.
*H01L 21/02* (2006.01)
*H01L 21/76* (2006.01)
(Continued)

(52) U.S. Cl.
CPC .. *H01L 21/02255* (2013.01); *H01L 21/02123* (2013.01); *H01L 21/02233* (2013.01); *H01L 21/3213* (2013.01); *H01L 21/76* (2013.01); *H01L 29/402* (2013.01); *H01L 29/4236* (2013.01)

(58) Field of Classification Search
None
See application file for complete search history.

(56) References Cited

U.S. PATENT DOCUMENTS 5,183,775 A * 2/1993 Levy ................. H01L 21/31662
438/386
9,691,864 B1 * 6/2017 Haase ............... H01L 29/66734
(Continued)

FOREIGN PATENT DOCUMENTS

| JP | H08-78403 A | 3/1996 |
|---|---|---|
| JP | 2004-14696 A | 1/2004 |
| JP | 2007-110071 A | 4/2007 |

*Primary Examiner* — Alexander G Ghyka
(74) *Attorney, Agent, or Firm* — Allen & Overy LLP

(57) ABSTRACT

A method for manufacturing a semiconductor device includes forming a trench in a semiconductor wafer; and forming a first insulating film by thermally oxidizing the semiconductor wafer. The first insulating film covers an inner surface of the trench so that a first space remains in the trench. The first insulating film has a recessed portion at the bottom of the trench. The method further includes forming a semiconductor layer on the first insulating film, the semiconductor layer filling the first space and the recessed portion; forming a second space in the trench by selectively removing the semiconductor layer so that a portion of the semiconductor layer remains in the recessed portion; forming a second insulating film in the recessed portion by thermally oxidizing the portion of the semiconductor layer; and forming a first conductive body in the trench, the first conductive body filling the second space.

10 Claims, 8 Drawing Sheets

(51) Int. Cl.
*H01L 29/40* (2006.01)
*H01L 21/3213* (2006.01)
*H01L 29/423* (2006.01)

(56) References Cited

U.S. PATENT DOCUMENTS

2002/0093041 A1* 7/2002 Hong ................ H01L 21/76224
257/E21.546
2018/0083128 A1* 3/2018 Yokoyama .......... H01L 29/0634

* cited by examiner ately the same as the actual values thereof. The dimensions and/or the

METHOD FOR MANUFACTURING SEMICONDUCTOR DEVICE

CROSS-REFERENCE TO RELATED APPLICATIONS

This application is based upon and claims the benefit of priority from Japanese Patent Application No. 2019-163790, filed on Sep. 9, 2019; the entire contents of which are incorporated herein by reference.

FIELD

Embodiments relate to a method for manufacturing a semiconductor device.

BACKGROUND

A power semiconductor device has a trench gate structure to reduce the ON resistance. Such a semiconductor device often includes a field plate provided in the trench with the gate electrode in order to improve the breakdown voltage between the source and the drain electrodes. However, there may be a case where the insulating film electrically isolating the field plate from the semiconductor layer has a less voltage resistance and makes a leak current increase.

DETAILED DESCRIPTION

Figure 1A:
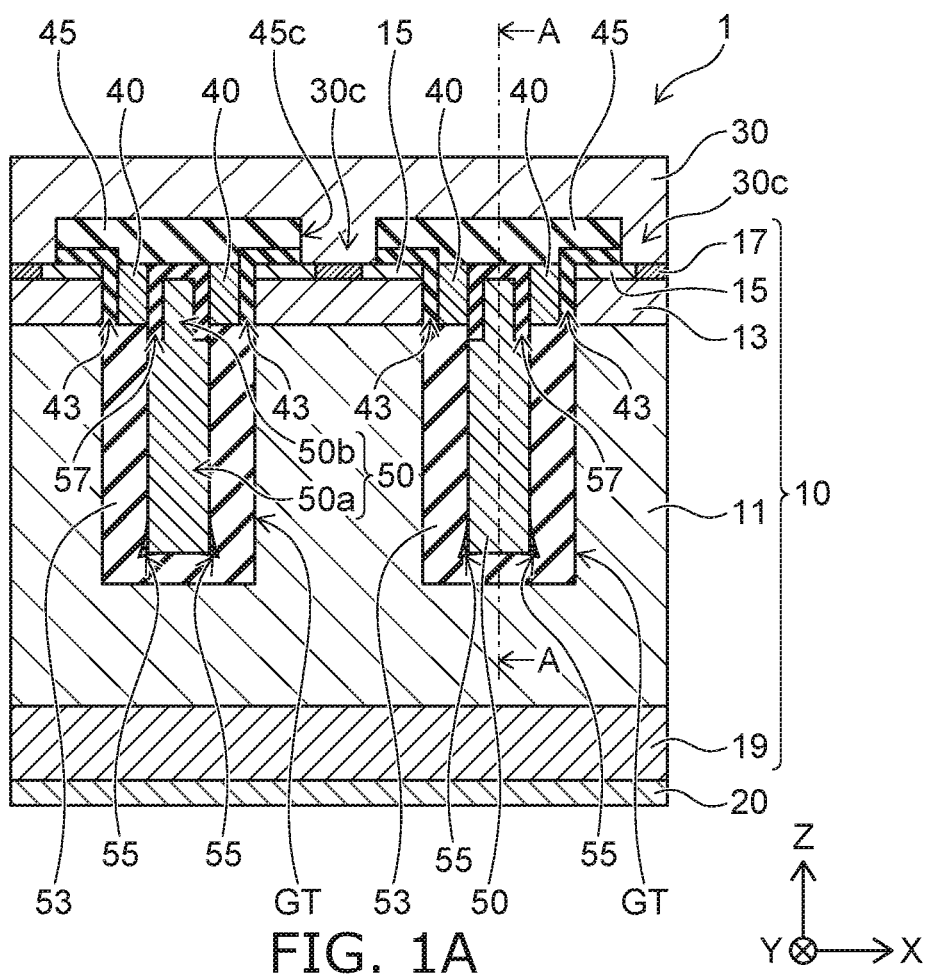
FIGS. 1A and 1B are schematic cross-sectional views showing a semiconductor device according to an embodiment.

According to one embodiment, a method for manufacturing a semiconductor device includes forming a trench in a semiconductor wafer; and forming a first insulating film by thermally oxidizing the semiconductor wafer, the first insulating film covering an inner surface of the trench so that a first space remains in the trench. The first insulating film has a recessed portion at the bottom of the trench. The method further includes forming a semiconductor layer on the first insulating film, the semiconductor layer filling the first space and the recessed portion of the first insulating film; forming a second space in the trench by selectively removing the semiconductor layer so that a portion of the semiconductor layer remains in the recessed portion of the first insulating film; forming a second insulating film in the recessed portion of the first insulating film by thermally oxidizing the portion of the semiconductor layer; and forming a first conductive body in the trench, the first conductive body filling the second space.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
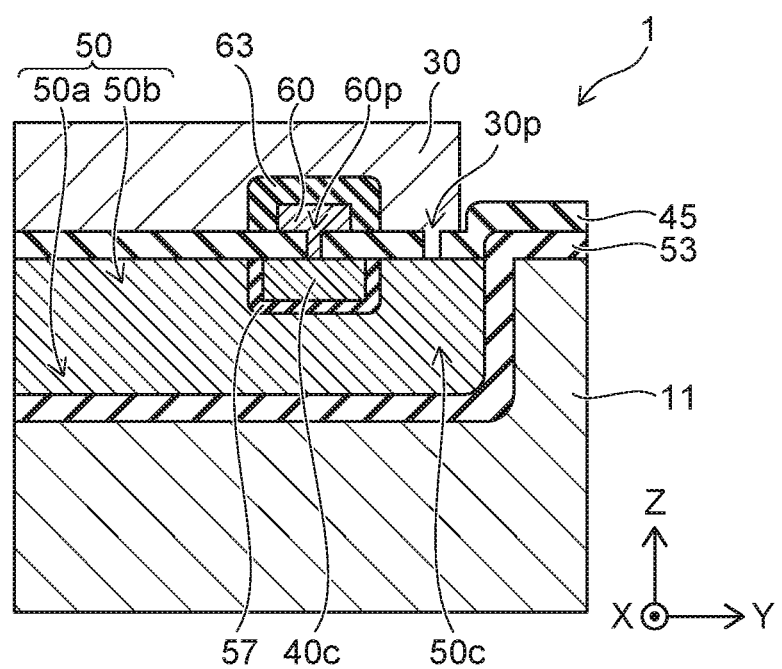

FIGS. 1A and 1B are schematic cross-sectional views showing a semiconductor device 1 according to the embodiment. FIG. 1B is the cross-sectional view of the semiconductor device 1 taken along A-A line in FIG. 1A. The semiconductor device 1 is, for example, a MOSFET which has a trench gate structure including a field plate.

As shown in FIG. 1, the semiconductor device 1 includes a semiconductor part 10, a drain electrode 20, a source electrode 30, a gate electrode 40 and a field plate 50. The semiconductor part 10 is, for example, silicon.

The drain electrode 20 is provided on the back surface of the semiconductor part 10. The source electrode 30 is provided at a front surface side of the semiconductor part 10. The gate electrode 40 is provided between the semiconductor part 10 and the source electrode 30. The gate electrode 40 is provided in a gate trench GT. The gate trench GT is provided in the semiconductor part 10. The field plate 50 is provided in the gate trench GT with the gate electrode 40.

The gate electrode 40 is electrically isolated from the semiconductor part 10 by the gate insulating film 43. The gate electrode 40 is electrically isolated from the source electrode 30 by an interlayer insulating film 45. In this example, two gate electrodes 40 are provided in one gate trench GT. The two gate electrodes 40 are arranged in a direction along the front surface of the semiconductor part 10 (for example, in the X-direction).

The field plate 50 includes, for example, a first portion 50a and a second portion 50b. The first portion 50a is provided in a lower portion of the gate trench GT, and the second portion 50b is provided in an upper portion of the gate trench GT. The second portion 50b is provided between the two gate electrodes 40. The first portion 50a is provided between the drain electrode 20 and the second portion 50b. The first portion 50a and the second portion 50b are provided with one body and, for example, electrically connected to the source electrode 30 (see FIG. 1B).

The first portion 50a is electrically isolated from the semiconductor part 10 by a field plate insulating film (hereinafter, FP insulating film 53). In this example, an insulating film 55 is further provided at the bottom of the gate trench GT. The insulating film 55 is provided between the first portion 50a and the FP insulating film 53. The insulating film 55 is provided to extend, for example, from the lower end of the first portion 50a toward the periphery of the bottom surface of the gate trench GT.

The second portion 50b is electrically isolated from the gate electrode 40 by an insulating film 57, The upper end of the second portion 50b is electrically isolated from the source electrode 30 by the insulating film 57 and the interlayer insulating film 45.

The semiconductor part 10 includes, for example, an n-type drift layer 11, a p-type diffusion layer 13, an n-type source layer 15, a p-type contact layer 17 and an n-type drain layer 19.

The n-type drift layer 11 extends in the lateral direction (e.g., X-direction and Y-direction) along the drain electrode 20. The p-type diffusion layer 13 is provided between the n-type drift layer 11 and the source electrode 30. The p-type diffusion layer 13 faces the gate electrode 40 via the gate insulating film 43.

The n-type source layer 15 is selectively provided between the p-type diffusion layer 13 and the source electrode 30. The n-type source layer 15 is in contact with the gate insulating film 43. The n-type source layer 15 includes an n-type impurity with a concentration higher than a concentration of an n-type impurity in the n-type drift layer 11.

The p-type contact layer 17 is selectively provided between the p-type diffusion layer 13 and the source electrode 30. The p-type contact layer 17 includes a p-type impurity with a concentration higher than a concentration of a p-type impurity in the p-type diffusion layer 13.

The n-type drain layer 19 is provided between the n-type drift layer 11 and the drain electrode 20. The n-type drain layer 19 includes a n-type impurity with a concentration higher than the concentration of the n-type impurity in the n-type drift layer 11. The drain electrode 20 is electrically connected to, for example, the n-type drain layer 19.

The source electrode 30 is electrically connected to the semiconductor part 10 via a contact portion 30c. The contact portion 30c contacts the semiconductor part 10 through a contact hole 45c provided in the interlayer insulating film 45.

The n-type source layer 15 and the p-type contact layer 17, for example, are exposed at the bottom surface of the contact hole 45c. The source electrode 30 is electrically connected to the n-type source layer 15 and the p-type contact layer 17 via the contact portion 30c. Moreover, the source electrode 30 is electrically connected to the p-type diffusion layer 13 via the p-type contact layer 17.

As shown in FIG. 1B, the field plate 50 extends in the Y-direction along the front surface of the semiconductor part 10, and has a connecting portion 50c at the end in the Y-direction. The source electrode 30 includes a contact portion 30p that extends through a contact hole of the interlayer insulating film 45. The contact portion 30p is provided on the connecting portion 50c of the field plate 50. The field plate 50 is electrically connected to the source electrode 30 via the contact portion 30p and the connecting portion 50c.

The two gate electrodes 40 (see FIG. 1A) are electrically connected to each other via the connecting portion 40c at the ends thereof in the Y-direction. The connecting portion 40c is provided between the field plate 50 and the interlayer insulating film 45. The connecting portion 40c is electrically isolated from the field plate 50 by the insulating film 57.

The semiconductor device 1 further includes a gate interconnect 60 provided above the connecting portion 40c with the interlayer insulating film 45 interposed. The gate interconnection 60 includes a contact portion 60p that extends into a contact hole of the interlayer insulating film 45. The gate interconnection 60 is electrically connected to the connecting portion 40c via the contact portion 60p. Thus, the two gate electrodes 40 are electrically connected to the gate interconnect 60.

The gate interconnect 60 is provided between the source electrode 30 and the interlayer insulating film 45, for example. The gate interconnect 60 is electrically isolated from the source electrode 30 by an insulating film 63.

Hereinafter, with reference to FIGS. 2A to 7B, a manufacturing method of the semiconductor device 1 will be described. FIGS. 2A to 7B are schematic cross-sectional views showing a manufacturing process of the semiconductor device 1 according to the embodiment.

Figure 2A:
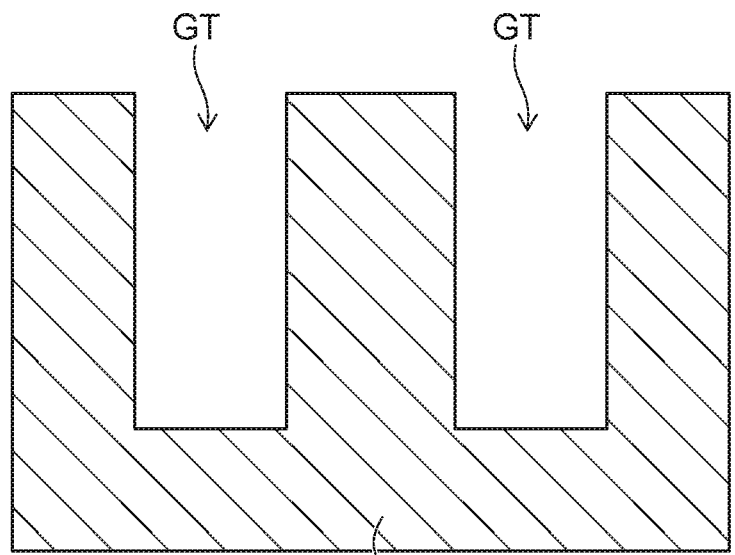
FIGS. 2A to 7B are schematic cross-sectional views showing a manufacturing process of the semiconductor device according to the embodiment.

As shown in FIG. 2A, the gate trench GT is formed at the front surface side of a semiconductor wafer 100. The gate trench GT is formed using, for example, anisotropic RIE (Reactive Ion Etching). The semiconductor wafer 100 is, for example, an n-type silicon wafer.

Figure 2B:
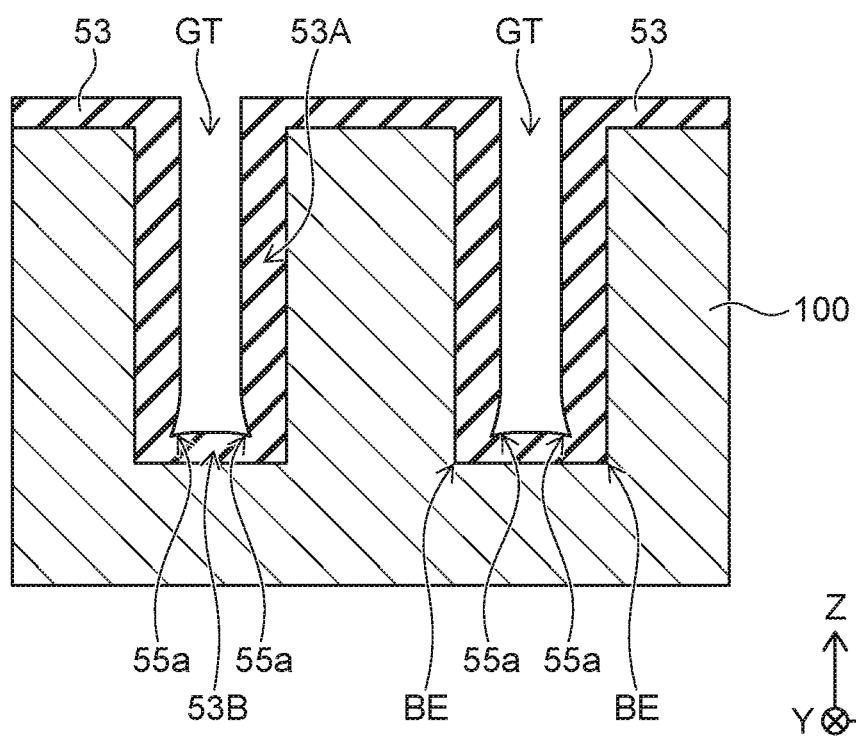

As shown in FIG. 2B, the FP insulating film 53 is formed by thermally oxidizing the semiconductor wafer 100, The FP insulating film 53 is, for example, a silicon oxide film. The FP insulating film 53 is formed to cover the inner surface of the gate trench GT so that a space remains in the gate trench GT, The FP insulating film 53 includes, for example, a first film 53A on the inner wall of the gate trench GT and a second film 53B on the bottom surface of the gate trench GT. For example, a thermal oxidation rate changes depending on a crystal plane orientation of silicon. Moreover, oxygen supply during the thermal oxidation is not uniform in the gate trench GT. Therefore, the FP insulating film 53 is not formed to be continuously connected with a uniform thickness. For example, the FP insulating film 53 is formed with a groove-shaped recessed portion 55a at the boundary between the first film 53A and the second film 53B. The recessed portion 55a is formed to extend toward, for example, the periphery BE of the bottom surface of the gate trench GT. Moreover, the first film 53A has a film thickness different from a film thickness of the second film 53B.

Figure 3A:
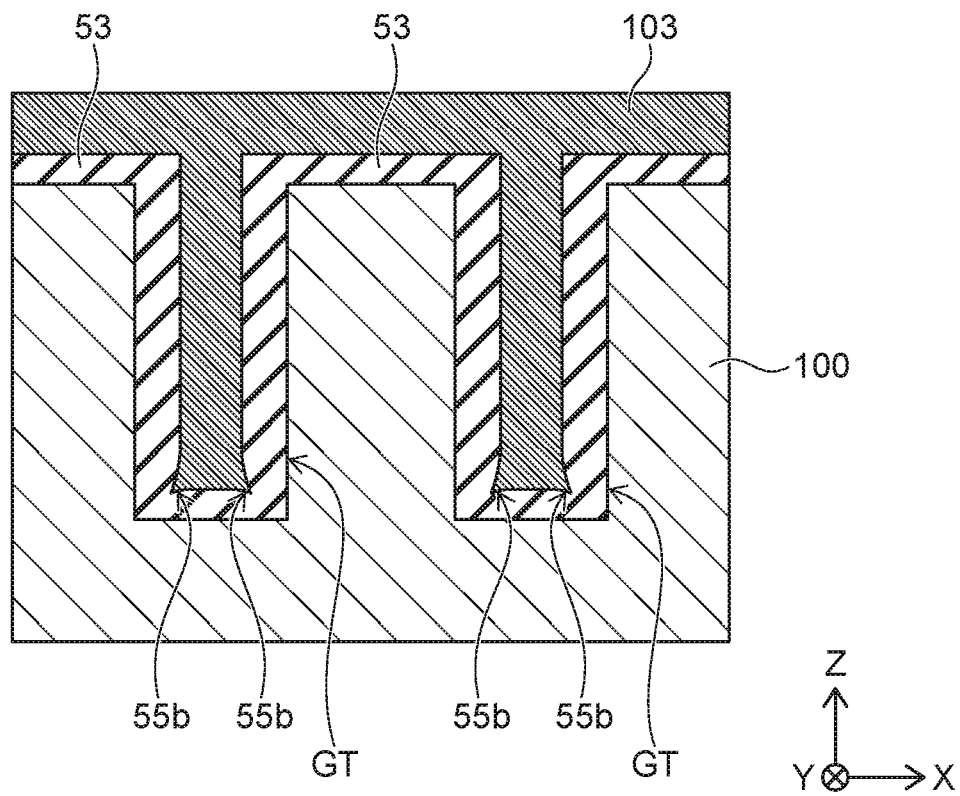

As shown in FIG. 3A, a semiconductor layer 103 is formed to fill the space in the gate trench GT. The semiconductor layer 103 is, for example, a polysilicon layer formed by CVD. The semiconductor layer 103 includes an embedded portion 55b that fills the recessed portion 55a.

Figure 3B:
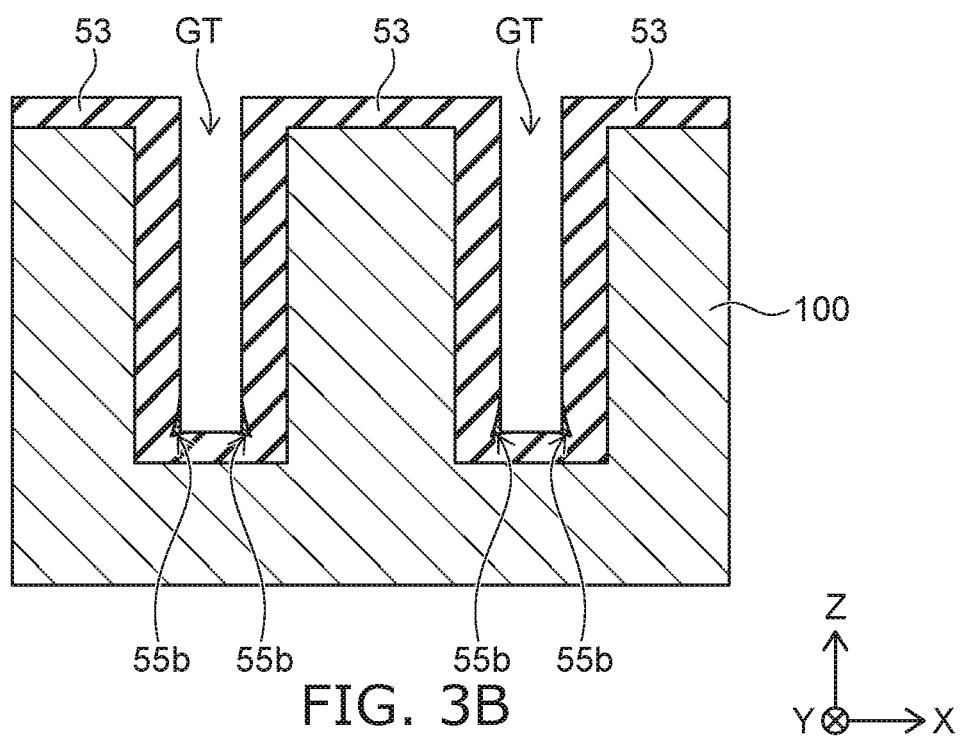

As shown in FIG. 3B, the semiconductor layer 103 is removed from the interior of the gate trench GT by selective etching so that the embedded portion 55b remains in the recessed portion 55a. The semiconductor layer 103 is removed under the condition in which the etching rate in the depth direction of the gate trench GT (e.g., the -Z-direction) is larger than the etching rate in the direction along the bottom surface of the gate trench GT (e.g., the X-direction). The semiconductor layer 103 is removed using, for example, anisotropic RIE.

Figure 4A:
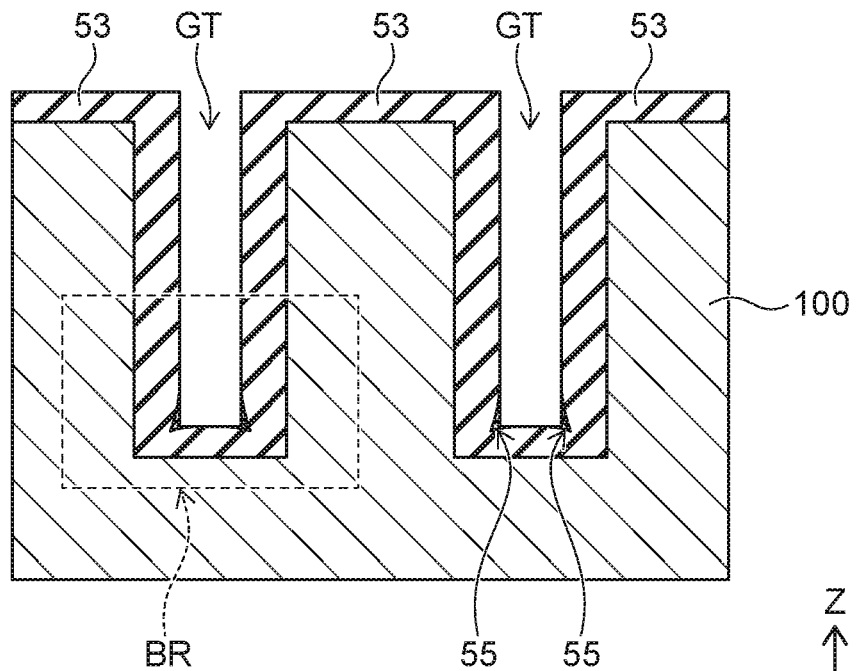
Figure 4B:
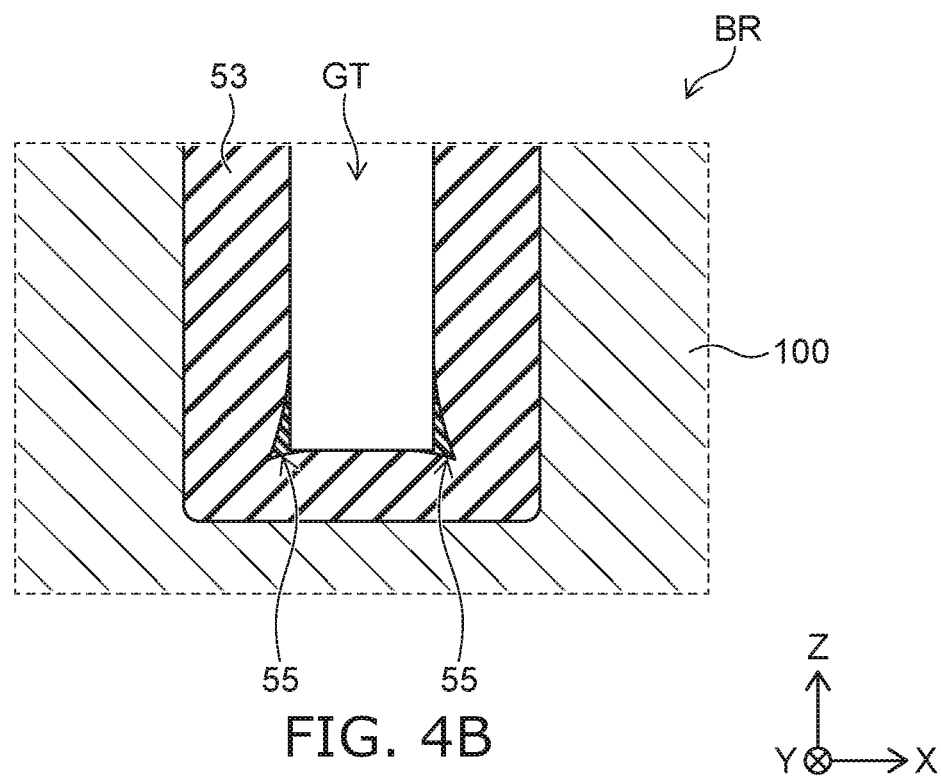

As shown in FIGS. 4A and 4B, the insulating film 55 is formed at the bottom of the trench gate GT. FIG. 4B is a schematic view showing the region BR in FIG. 4A.

The insulating film 55 is formed by thermally oxidizing the embedded portion 55b. The insulating film 55 is, for example, a silicon oxide film. The insulating film 55 is formed to fill the recessed portion 55a (see FIG. 2B).

Figure 5A:
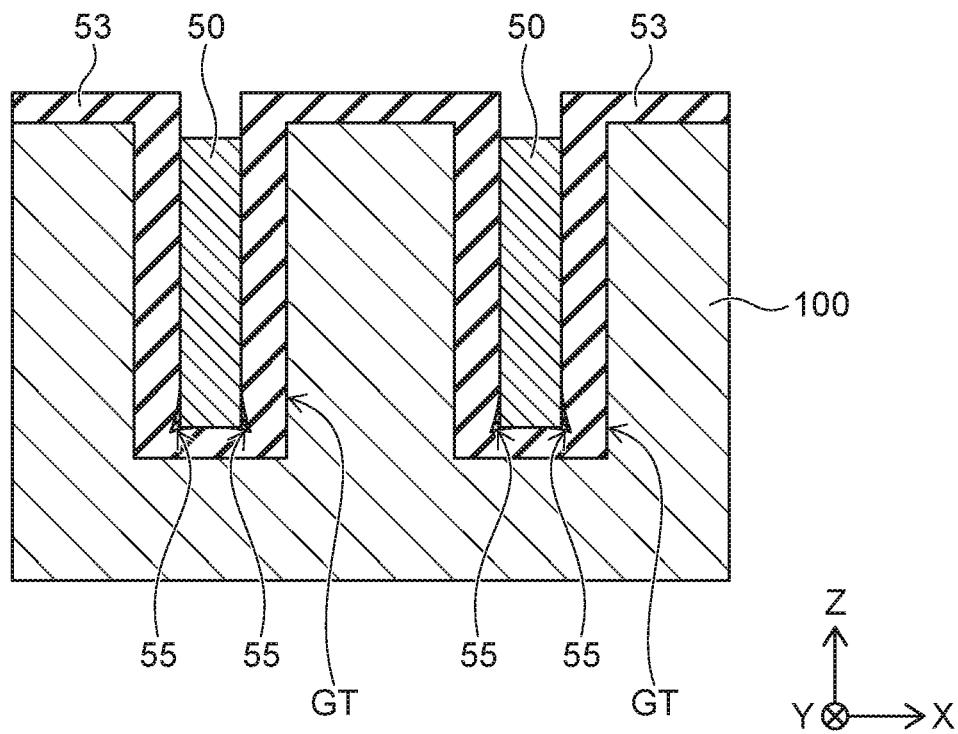

As shown in FIG. 5A, the field plate 50 is formed in the gate trench GT. The field plate 50 is formed in the space formed by removing the semiconductor layer 103. The field plate 50 is, for example, conductive polysilicon formed by CVD.

Figure 5B:
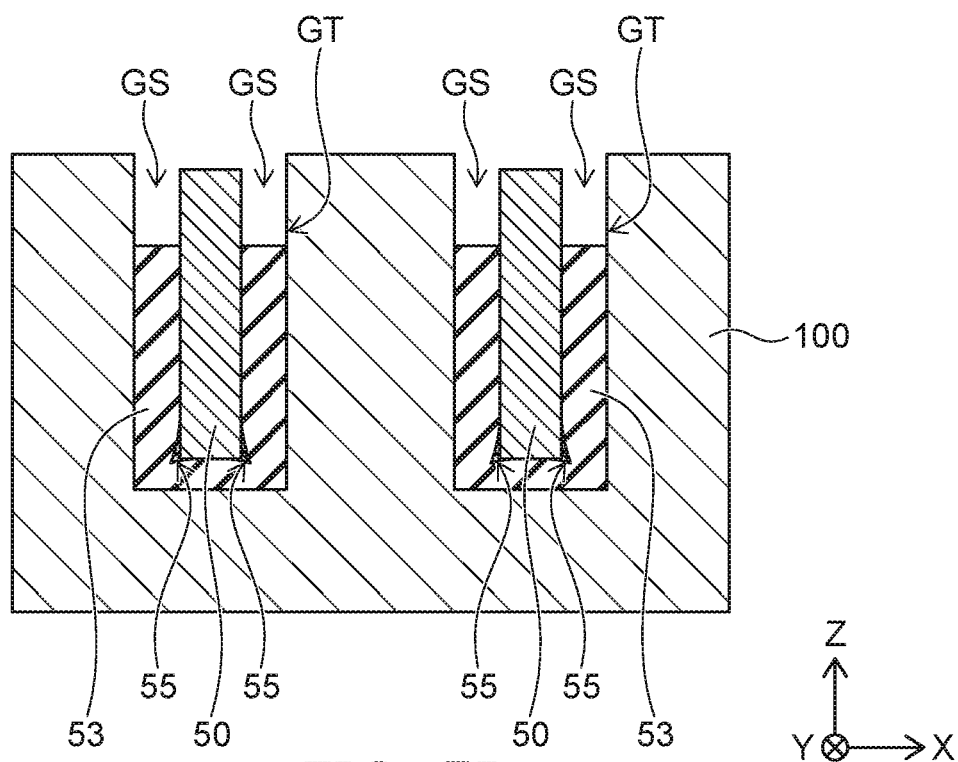

As shown in FIG. 5B, the FP insulating film 53 is selectively removed to form a gate space GS at the upper portion of the gate trench GT. The upper end of the field plate 50 is exposed to the gate space GS with the inner wall of the gate trench GT.

Figure 6A:
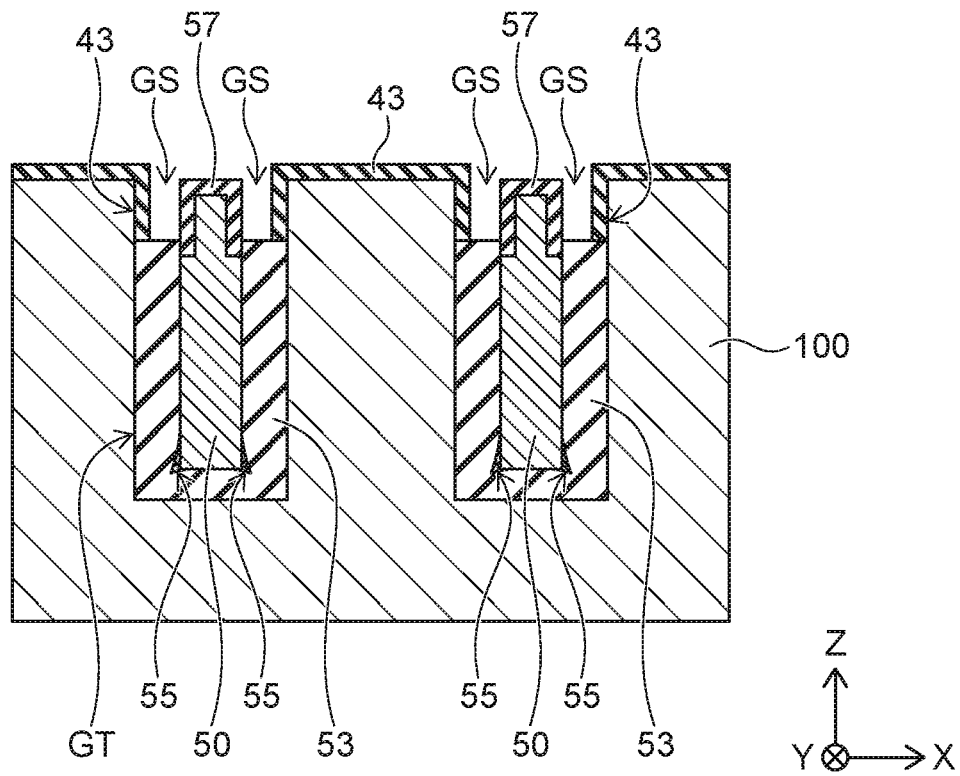

As shown in FIG. 6A, the gate insulating film 43 and the insulating film 57 are formed. The gate insulating film 43 is formed by thermally oxidizing the semiconductor wafer 100 exposed to the gate space GS. The insulating film 57 is formed by thermally oxidizing the upper end of the field plate 50. The gate insulating film 43 is formed to be thinner than the FP insulating film 53 in a direction orthogonal to the inner wall of the gate trench GT.

Figure 6B:
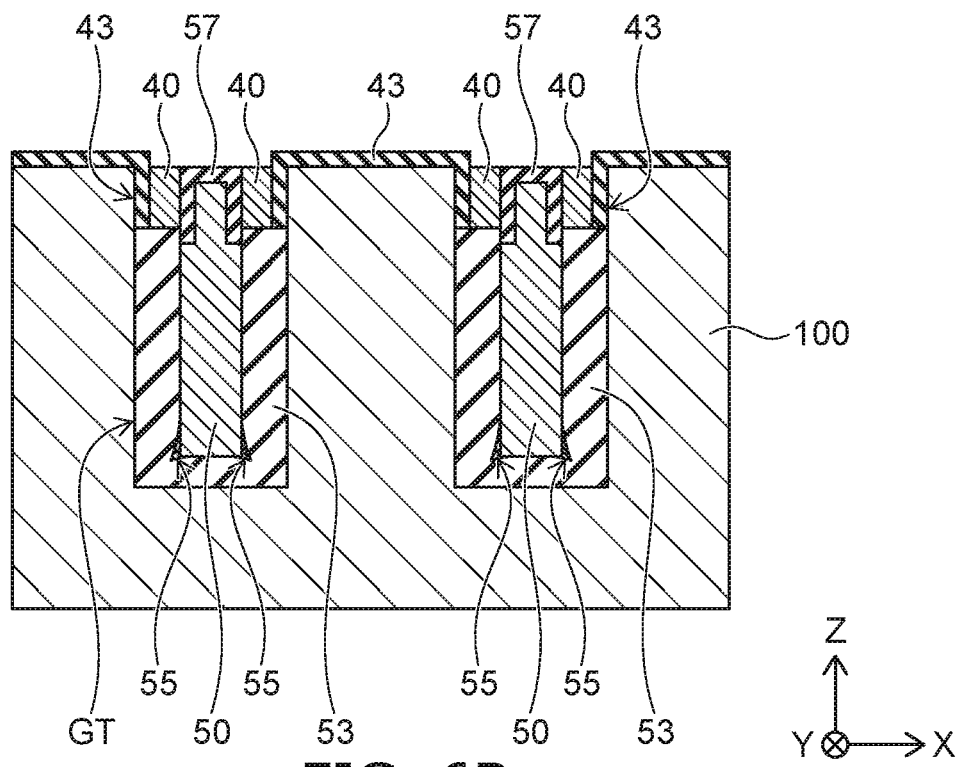

As shown in FIG. 6B, the gate electrode 40 is formed in the gate space GS. The gate electrode 40 is, for example, conductive polysilicon formed by CVD.

Figure 7A:
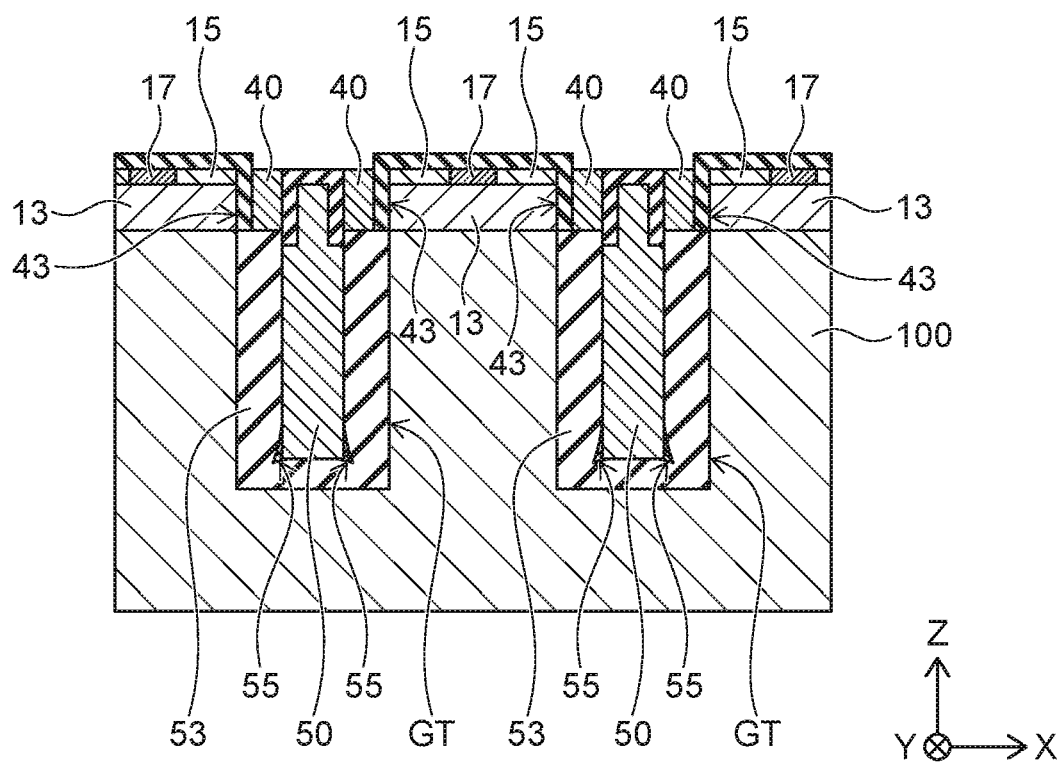

As shown in FIG. 7A, the p-type diffusion layer 13, the n-type source layer 15 and the p-type contact layer 17 are formed.

The p-type diffusion layer 13 is formed by ion-implanting a p-type impurity such as boron (B) through the front surface side of the semiconductor wafer 100, and then, by heat treating the semiconductor wafer 100. The p-type diffusion layer 13 faces the gate electrode 40 via the gate insulating film 43. The p-type diffusion layer 13 is formed such that the depth from the front surface of the semiconductor wafer 100 is shallower than the lower end of the gate electrode 40.

The n-type source layer 15 is formed by selectively ion-implanting an n-type impurity such as phosphorus (P) into the p-type diffusion layer 13, and then, by heat treating the semiconductor wafer 100. The n-type source layer 15 includes the n-type impurity with a concentration higher than the concentration of the p-type impurity in the p-type diffusion layer 13. The n-type source layer 15 is formed such that the depth thereof from the front surface of the semiconductor wafer 100 is smaller than the depth of the p-type diffusion layer 13. The n-type source layer 15 is in contact with the gate insulating film 43.

The p-type contact layer 17 is formed by selectively ion-implanting a p-type impurity such as boron (B) into the p-type diffusion layer 13 and by heat treating the semiconductor wafer 100. The p-type contact layer 17 includes the p-type impurity with a concentration higher than the concentration of the p-type impurity in the p-type diffusion layer 13. The p-type contact layer 17 is formed such that the depth thereof from the front surface of the semiconductor wafer 100 is smaller than the depth of the p-type diffusion layer 13.

Figure 7B:
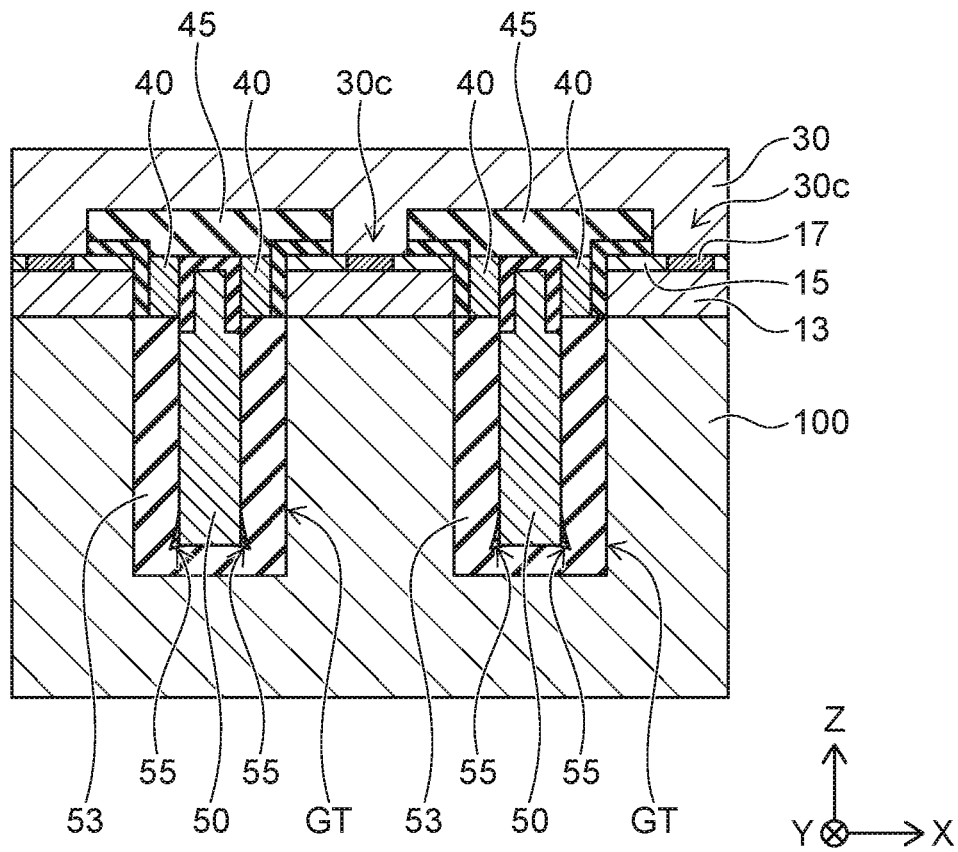

As shown in FIG. 7B, the interlayer insulating film 45 is formed on the front surface of the semiconductor wafer 100, and then the source electrode 30 is formed over the front surface. The interlayer insulating film 45 is, for example, a silicon oxide film formed by CVD. The source electrode 30 is, for example, a metal layer including tungsten (W) and aluminum (Al).

The source electrode 30 includes the contact portion 30c that contacts the n-type source layer 15 and the p-type contact layer 17 through the contact hole provided in the interlayer insulating film 45. The source electrode 30 is electrically connected to the n-type source layer 15 and the p-type contact layer 17 via the contact portion 30c.

Subsequently, the semiconductor wafer 100 is thinned by grinding or etching the back surface thereof. Further, the n-type drain layer 19 (see FIG. 1) is formed by ion-implanting the n-type impurity such as phosphor (P) at the back surface side of the semiconductor wafer 100, and by the heat treatment.

Subsequently, the drain electrode 20 (see FIG. 1) is formed on the back surface to complete the semiconductor device 1. The drain electrode 20 includes, for example, aluminum (Al), titanium (Ti) or the like.

In the manufacturing process described above, for example, when the insulating film 55 is not formed by omitting the manufacturing steps shown in FIGS. 3A to 4A, the field plate 50 is formed to have a protrusion filling the recessed portion 55a. That is, the FP insulating film 53 is formed to include a thin portion along the periphery of the bottom surface of the gate trench GT. Therefore, the FP insulating film 53 has the voltage resistance which decreases at the periphery of the bottom surface of the gate trench GT. When the gate electrode 40 is biased so that the drain-source current is tuned off, the electric field concentrates at the protrusion of the field plate 50. Thus, the recessed portion 55a of the FP insulating film 53 reduces the voltage resistance between the n-type drift layer 11 and the field plate 50, and the leak current increases.

In the embodiment, it is possible to improve the voltage resistance between the n-type drift layer 11 and the field plate 50 by forming the insulating film 55 which fills the recessed portion 55a of the FP insulating film 53, and the leak current is reduced between the source and drain electrodes.

Figure 8A:
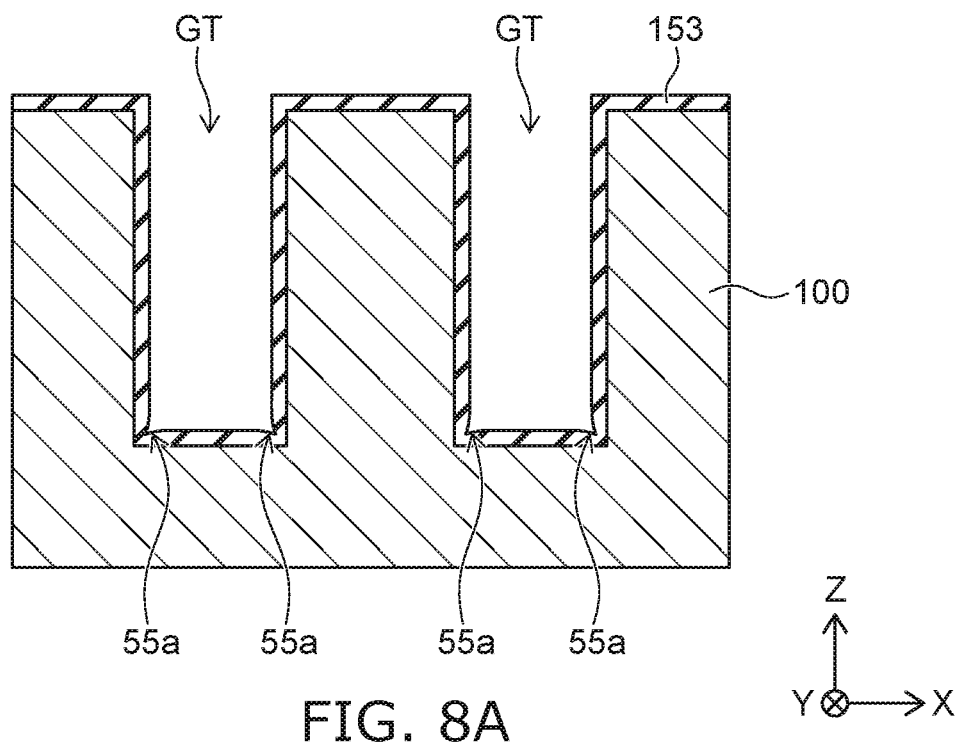
FIGS. 8A and 8B are schematic cross-sectional views showing a manufacturing process of a semiconductor device according to a comparative example.
Figure 8B:
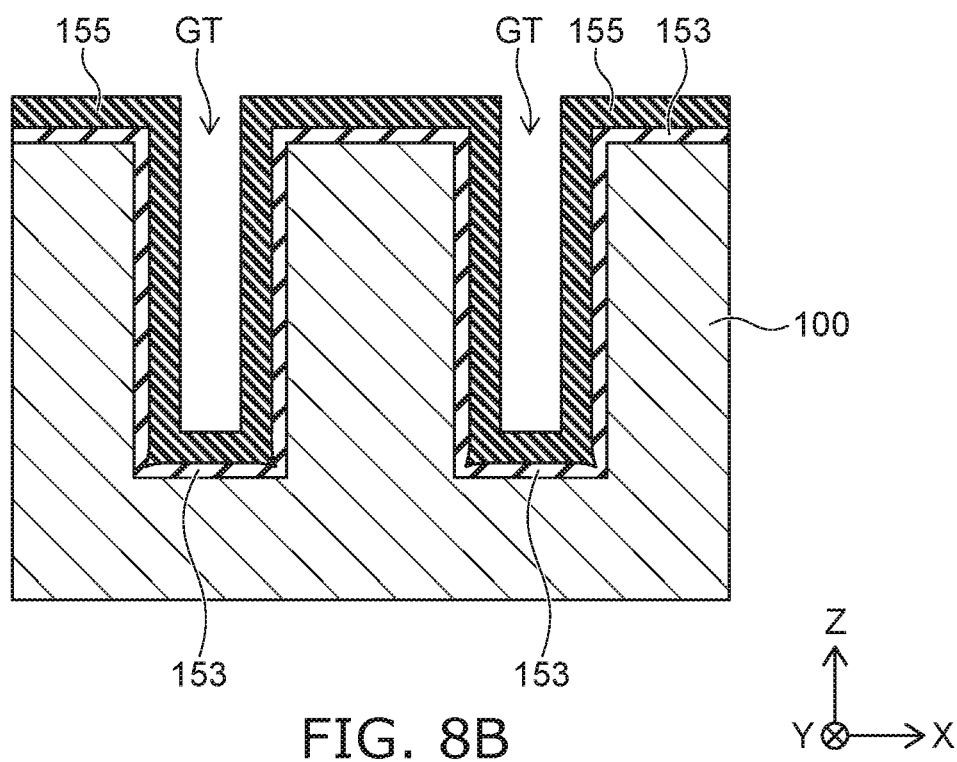

FIGS. 8A and 8B are schematic cross-sectional views showing a manufacturing process of a semiconductor device according to a comparative example. FIGS. 8A and 8B are schematic views showing the cross-section of the semiconductor wafer 100.

As shown in FIG. 8A, an insulating film 153 is formed to cover the inner surface of the gate trench GT. The insulating film 153 is formed by thermally oxidizing the semiconductor wafer 100. The insulating film 153 is formed to be thinner than the FP insulating film 53. Also, in this example, the insulating film 153 has the recessed portion 55a at the boundary between the portion on the bottom surface and another portion on the inner wall of the gate trench GT.

As shown in FIG. 8B, an insulating film 155 is formed to cover the inner surface of the gate trench GT. The insulating film 155 is, for example, a silicon oxide film formed by CVD.

In this example, the recessed portion 55a of the insulating film 153 is filled with the insulating film 155. The insulating film 155 does not include a thin thickness portion such as the recessed portion 55a. Therefore, when the FP insulating film provided by combining the insulating films 153 and 155, the voltage resistance does not decrease at the periphery of the bottom surface in the gate trench GT.

However, the voltage resistance in the FP insulating film including the insulating film 155 formed by CVD is lower than that of the FP insulating film 53 formed by thermal oxidation. Moreover, in the semiconductor wafer 100, the thickness distribution in the FP insulating film including the insulating film 155 is larger than the thickness distribution of the FP insulating film 53. Thus, the voltage resistance of the FP insulating film formed by the manufacturing method of the comparative example is lower than the voltage resistance of the FP insulating film 53 formed by thermal oxidation. The variation of the voltage resistance is also large in the FP insulating film formed by the manufacturing method according to the comparative example.

In the manufacturing method according to the embodiment, it is possible to improve the voltage resistance between the field plate 50 and the n-type drift layer 11 by forming the FP insulating film 53 using thermal oxidization and filling the recessed portion 55a with the insulating film 55. Thereby, it is also possible to improve the reliability of the semiconductor device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention,

What is claimed is:

1. A method for manufacturing a semiconductor device, the method comprising:
   forming a trench in a semiconductor wafer;
   forming a first insulating film by thermally oxidizing the semiconductor wafer, the first insulating film covering an inner surface of the trench so that a first space remains in the trench, the first insulating film having a recessed portion at a bottom of the trench;
   forming a semiconductor layer on the first insulating film, the semiconductor layer filling the first space and the recessed portion of the first insulating film;
   forming a second space in the trench by selectively removing the semiconductor layer so that a portion of the semiconductor layer remains in the recessed portion of the first insulating film;
   forming a second insulating film in the recessed portion of the first insulating film by thermally oxidizing the portion of the semiconductor layer; and
   forming a first conductive body in the trench, the first conductive body filling the second space.

2. The method according to claim 1, wherein
   the first insulating film includes a first portion on a bottom of the trench and a second portion on an inner wall of the trench, and
   the recessed portion is formed at a boundary between the first portion and the second portion.

3. The method according to claim 2, wherein the first portion of the first insulating film has a film thickness different from a film thickness of the second portion of the first insulating film.

4. The method according to claim 2, wherein the second insulating film is formed at a boundary between the first and second portions of the first insulating film.

5. The method according to claim 1, wherein the first insulating film includes a portion positioned between the second insulating film and the semiconductor wafer.

6. The method according to claim 1, wherein
   the semiconductor layer is a polysilicon layer, and
   the second insulating film is a silicon oxide film.

7. The method according to claim 1, wherein
   the second insulating film is formed to protrude in a direction from an end of the first conductive body toward a periphery of the bottom surface in the trench.

8. The method according to claim 1, wherein
   the semiconductor layer is removed under an etching condition in which an etching rate in a depth direction of the trench is faster than an etching rate in a direction along a bottom surface in the trench.

9. The method according to claim 1, further comprising:
   removing a portion of the first insulating film at an opening side of the trench, an inner wall of the trench being exposed to a space formed by removing the portion of the first insulating film;
   forming a third insulating film on the inner wall at the opening side of the trench by thermally oxidizing the semiconductor wafer, the third insulating film being thinner than the first insulating film; and
   filling the space with a second conductive body, the second conductive body being electrically isolated from the semiconductor wafer by the third insulating film,
   the second conductive body being electrically isolated from the first conductive body by a fourth insulating film, the fourth insulating film being formed by thermally oxidizing the first conductive body with the semiconductor wafer.

10. The method according to claim 9, further comprising:
    forming a first semiconductor region by ion-implanting a first impurity of a first conductivity type at a front surface side of the semiconductor wafer, the first conductivity type being different from a conductivity type of the semiconductor wafer, the trench being formed at the front surface side; and
    forming a second semiconductor region by ion-implanting a second impurity of a second conductivity type at the front surface side of the first semiconductor region, the second conductivity type being same as the conductivity type of the semiconductor wafer,
    the first semiconductor region being formed to face the second conductive body via the third insulating film.

* * * * *